(12) United States Patent
Hori et al.

(10) Patent No.: US 9,577,046 B1
(45) Date of Patent: Feb. 21, 2017

(54) SEMICONDUCTOR DEVICE

(71) Applicant: KABUSHIKI KAISHA TOSHIBA, Tokyo (JP)

(72) Inventors: Yoichi Hori, Himeji Hyogo (JP); Tsuyoshi Oota, Ibo Hyogo (JP); Hiroshi Kono, Himeji Hyogo (JP); Atsuko Yamashita, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,202

(22) Filed: Mar. 7, 2016

(30) Foreign Application Priority Data

Sep. 11, 2015 (JP) .................................. 2015-179130

(51) Int. Cl.
| | |
|---|---|
| *H01L 29/16* | (2006.01) |
| *H01L 29/06* | (2006.01) |
| *H01L 29/45* | (2006.01) |
| *H01L 29/872* | (2006.01) |
| *H01L 29/868* | (2006.01) |

(52) U.S. Cl.
CPC ........ *H01L 29/1608* (2013.01); *H01L 29/063* (2013.01); *H01L 29/0684* (2013.01); *H01L 29/45* (2013.01); *H01L 29/868* (2013.01); *H01L 29/872* (2013.01)

(58) Field of Classification Search
CPC ............... H01L 29/1608; H01L 29/063; H01L 29/0684; H01L 29/872; H01L 29/868; H01L 29/45
See application file for complete search history.

(56) References Cited

U.S. PATENT DOCUMENTS

| 8,232,558 B2 | 7/2012 | Zhang et al. |
|---|---|---|
| 8,866,151 B2 | 10/2014 | Noda et al. |

(Continued)

FOREIGN PATENT DOCUMENTS

| JP | 2013-115394 A | 6/2013 |
|---|---|---|
| JP | 2014-175377 A | 9/2014 |
| TW | 201227973 A | 7/2012 |

OTHER PUBLICATIONS

Taiwan Office Action dated Nov. 15, 2016 in counterpart Taiwan Patent Application 105107238 with English Translation.

*Primary Examiner* — Roy Potter
*Assistant Examiner* — Paul Patton
(74) *Attorney, Agent, or Firm* — Patterson & Sheridan, LLP

(57) ABSTRACT

A semiconductor device includes a semiconductor layer having a first surface and a second surface, a first electrode on the first surface, a second electrode on the second surface, a first semiconductor region of a first conductivity type in the semiconductor layer, a second semiconductor region of a second conductivity type in an element region of the semiconductor layer between the first semiconductor region and the first electrode, a third semiconductor region of the second conductivity type between the second semiconductor region and the first electrode, and a fourth semiconductor region of the second conductivity type in a termination region of the semiconductor layer inwardly of the first surface. A distance between the fourth semiconductor region and the second surface is greater than a distance between the second semiconductor region and the second surface.

20 Claims, 4 Drawing Sheets

(56) References Cited

U.S. PATENT DOCUMENTS

| | | | |
|---|---|---|---|
| 8,901,699 B2* | 12/2014 | Ryu | ................. H01L 29/872 257/472 |
| 9,142,687 B2 | 9/2015 | Hori et al. | |
| 2012/0241762 A1 | 9/2012 | Noda et al. | |
| 2015/0001552 A1 | 1/2015 | Hori et al. | |

\* cited by examiner

US 9,577,046 B1

SEMICONDUCTOR DEVICE

CROSS-REFERENCE TO RELATED APPLICATION

This application is based upon and claims the benefit of priority from Japanese Patent Application No. 2015-179130, filed Sep. 11, 2015, the entire contents of which are incorporated herein by reference.

FIELD

Embodiments described herein relate generally to a semiconductor device.

BACKGROUND

In a Schottky barrier diode (SBD) or a junction barrier Schottky diode (JBS) which is a type of the SBD, a PIN diode section may be provided in an element region as a countermeasure against a forward surge current. By providing the PIN diode section in the element region, it is possible to make a large surge current flow through the PIN diode section by modulating the conductivity of the PIN diode section.

In addition, in the SBD or the JBS, a termination structure is provided in a termination region in the periphery of an element region, in order to reduce the strength of an electric field in an end portion of the element region at the time of a reverse bias and to prevent an element from breaking down. The termination structure is, for example, a RESURF (reduced surface field) or guard ring.

It is preferable that a junction breakdown voltage of the element region is lower than that of the termination structure from a viewpoint of preventing an element breakdown at the time of a reverse bias.

DETAILED DESCRIPTION

Figure 1:
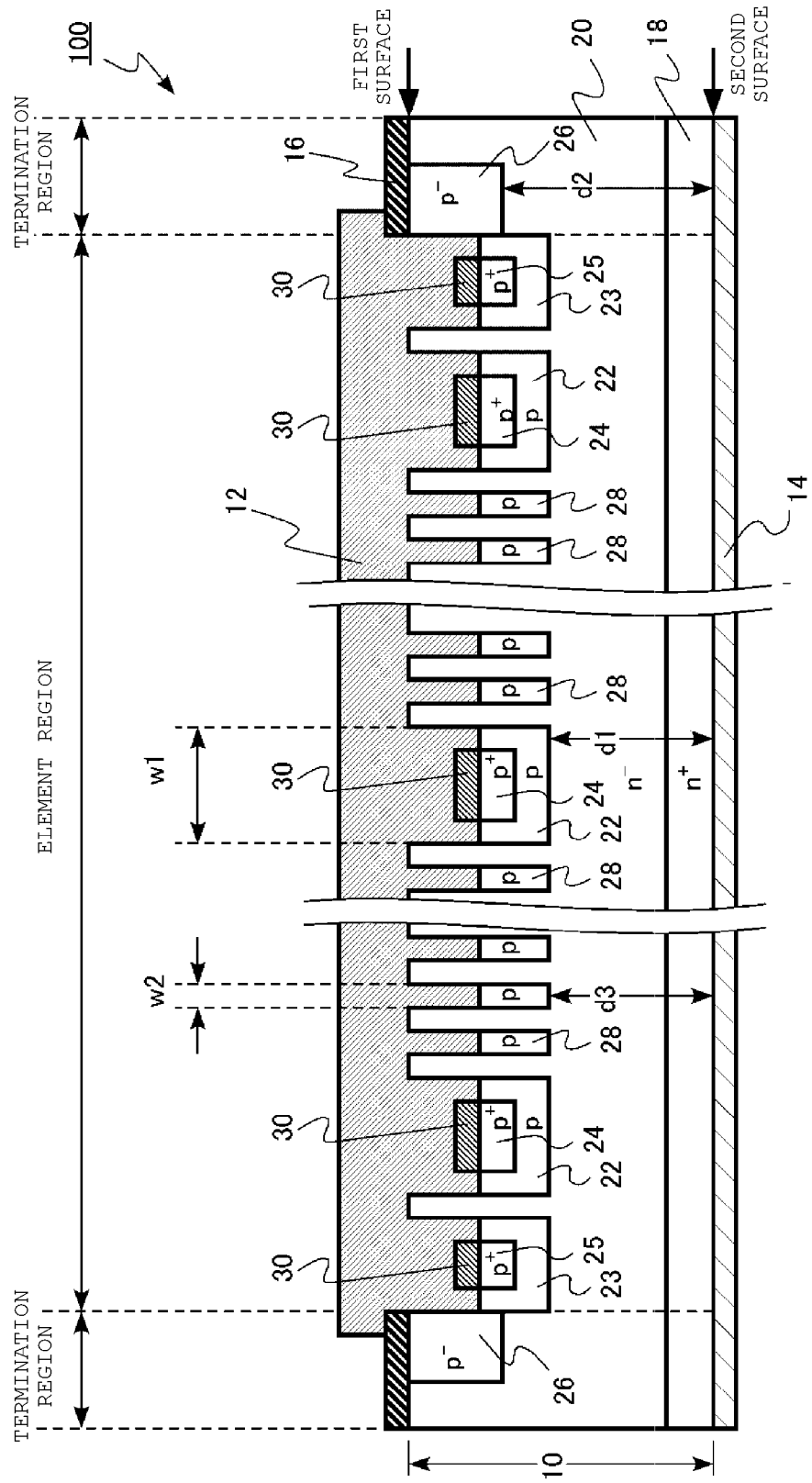
FIG. 1 is a schematic sectional view of a semiconductor device according to a first embodiment.

Embodiments provide a semiconductor device which can prevent element breakdown at the time of a reverse bias.

In general, according to one embodiment, a semiconductor device includes a semiconductor layer having a first surface and a second surface and including an element region surrounded by a termination region, a first electrode on the first surface, a second electrode on the second surface, a first semiconductor region of a first conductivity type in the semiconductor layer, a portion of the first semiconductor region being in contact with the first electrode, a second semiconductor region of a second conductivity type in the element region of the semiconductor layer between the first semiconductor region and the first electrode, a third semiconductor region of the second conductivity type that is between the second semiconductor region and the first electrode, and is electrically coupled to the first electrode, an impurity concentration of the second conductivity type in the third semiconductor region being higher than an impurity concentration of the second conductivity type in the second semiconductor region, and a fourth semiconductor region of the second conductivity type that is in the termination region of the semiconductor layer inwardly of the first surface, and is electrically coupled to the first electrode. A distance between the fourth semiconductor region and the second surface is greater than a distance between the second semiconductor region and the second surface.

Hereinafter, embodiments will be descried with reference to the drawings. In the following description, the same symbols or reference numerals will be given to the same or similar elements, and description of the elements described once will be repeated only as needed.

In addition, in the following description, notation of $n^+$, $n$ and $n^-$, and $p^+$, $p$ and $p^-$ represents relative levels of impurity concentrations of each conductivity type. That is, $n^+$-type impurity concentration is higher than n-type impurity concentration, and $n^-$-type impurity concentration is lower than n-type impurity concentration. In addition, $p^+$-type impurity concentration is higher than p-type impurity concentration, and $p^-$-type impurity concentration is lower than p-type impurity concentration. There is a case in which $n^+$ and $n^-$ are simply described as an n-type, and $p^+$ and $p^-$ are simply described as a p-type.

Impurity concentration can be measured by, for example, a secondary ion mass spectrometry (SIMS). In addition, a relative level of the impurity concentration can also be determined from a level of carrier concentration which is obtained by, for example, a scanning capacitance microscopy (SCM). In addition, a distance of a depth or the like of an impurity region can be obtained by, for example, a SIMS. In addition, the distance of the depth or the like of the impurity region can be obtained from a synthetic image of, for example, a SCM image and an atomic force microscope (AFM) image.

First Embodiment

A semiconductor device according to the present embodiment includes: an element region which is a portion of a semiconductor layer having a first surface and a second surface; a termination region which is a portion of the semiconductor layer and surrounds the element region; a first electrode which is provided on the first surface; a second electrode which is provided on the second surface; a first semiconductor region of a first conductivity type which is provided in the semiconductor layer and a portion of which comes into contact with the first electrode; a second semiconductor region of a second conductivity type which is provided between the first semiconductor region in the element region and the first electrode; a third semiconductor region of the second conductivity type which is provided between the second semiconductor region and the first electrode, is electrically coupled to the first electrode, and in which impurity concentration of the second conductivity type is higher than impurity concentration of the second semiconductor region; and a fourth semiconductor region of the second conductivity type which is provided between the first semiconductor region in the termination region and the first surface, is electrically coupled to the first electrode, and in which a distance between the fourth semiconductor region and the second surface is greater than a distance between the second surface and the second semiconductor region.

A semiconductor device according to the present embodiment includes: a semiconductor layer having a first surface and a second surface; a first electrode which is provided on the first surface; a second electrode which is provided on the second surface; a first semiconductor region of a first conductivity type which is provided in the semiconductor layer and a portion of which comes into contact with the first electrode; a second semiconductor region of a second conductivity type which is provided in the semiconductor layer between the first semiconductor region and the first electrode; a third semiconductor region of the second conductivity type which is provided in the semiconductor layer between the second semiconductor region and the first electrode, is electrically coupled to the first electrode, and in which impurity concentration of the second conductivity type is higher than impurity concentration of the second semiconductor region; and a fourth semiconductor region of the second conductivity type which is provided in the semiconductor layer so as to surround the second semiconductor region, is electrically coupled to the first electrode, and in which a distance between the fourth semiconductor region and the second surface is greater than a distance between the second surface and the second semiconductor region.

Figure 2:
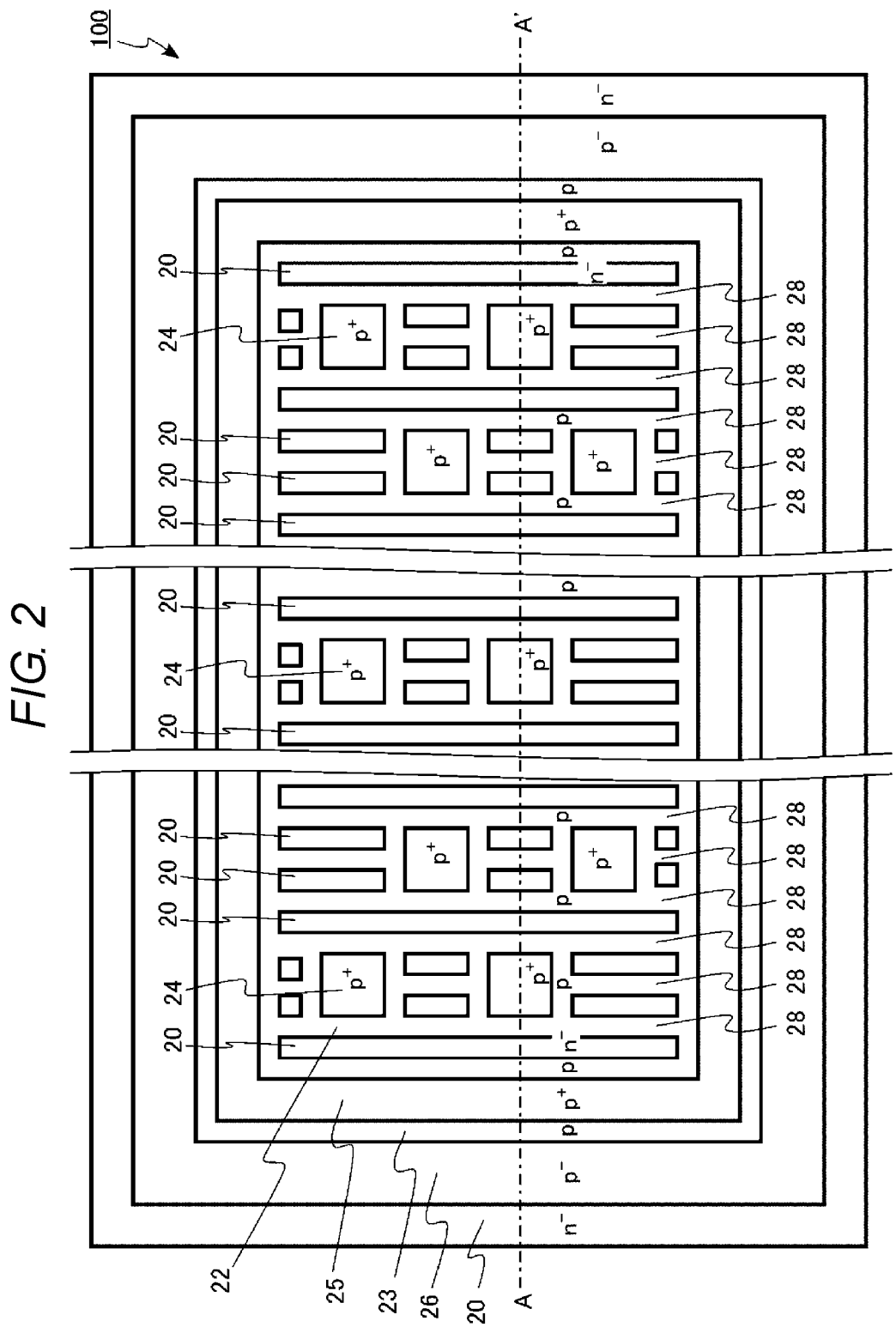
FIG. 2 is a schematic top view of the semiconductor device according to the first embodiment.

FIG. 1 is a schematic sectional view of a semiconductor device according to the present embodiment. FIG. 2 is a schematic top view of the semiconductor device according to the present embodiment. FIG. 2 illustrates an impurity region on a first surface side of a semiconductor layer. FIG. 1 corresponds to a cross section taken along line A-A' of FIG. 2.

The semiconductor device according to the present embodiment is a junction barrier Schottky (JBS) diode. The JBS diode 100 according to the present embodiment is a trench type JBS diode 100 in which a p-type region is provided in a bottom portion of a trench formed in an element region.

A semiconductor layer of the JBS diode 100 includes an element region and a termination region. The element region is surrounded by the termination region.

The element region functions as a region through which a current mainly flows at the time the JBS diode 100 is under a forward bias. The termination region functions as a region which reduces the strength of an electric field that is applied to an end portion of the element region at the time the JBS diode 100 is under a reverse bias and increases breakdown voltages of elements of the JBS diode 100.

The JBS diode 100 includes an SiC layer (semiconductor layer) 10, an anode electrode (first electrode) 12, a cathode electrode (second electrode) 14, a field oxide film 16, and a silicide layer 30. The SiC layer 10 has a first surface and a second surface. The anode electrode 12 is provided on the first surface of the SiC layer 10. The cathode electrode 14 is provided on the second surface of the SiC layer 10. The field oxide film 16 is provided on the first surface of the SiC layer 10.

The SiC layer 10 includes an n$^+$-type cathode region (sixth semiconductor region) 18, an n$^-$-type drift region (first semiconductor region) 20, a first anode region of a p-type (second semiconductor region) 22, a second anode region of a p$^+$-type (third semiconductor region) 24, a p$^-$-type RESURF region (fourth semiconductor region) 26, a p-type region (fifth semiconductor region) 28, a p-type edge region 23, and a p$^+$-type edge contact region 25.

The first anode region of a p-type (second semiconductor region) 22, the second anode region of a p$^+$-type (third semiconductor region) 24, and the p-type region (fifth semiconductor region) 28 are provided in the element region. The p$^-$-type RESURF region (fourth semiconductor region) 26 is provided in the termination region.

The SiC layer 10 is SiC (silicon carbide) of single crystal. The SiC layer 10 is, for example, 4H—SiC. A case in which the first surface of the SiC layer 10 is a surface inclined at an angle greater than or equal to zero degrees and smaller than or equal to eight degrees with respect to (0001) surface, and the second surface is a surface inclined at an angle greater than or equal to zero degrees and smaller than or equal to eight degrees with respect to (000-1) surface will be used as an example. The (0001) surface is referred to as a silicon surface. The (000-1) surface is referred to as a carbon surface.

The n$^+$-type cathode region 18 is provided in the SiC layer 10. The n$^+$-type cathode region 18 is provided between the cathode electrode 14 and the n$^-$-type drift region 20.

The n$^+$-type cathode region 18 contains n-type impurity. The n-type impurity is, for example, nitride (N). Impurity concentration of the n-type impurity is, for example, higher than or equal to $1\times10^{18}$ cm$^3$ and lower than or equal to $1\times10^{21}$ cm$^{-3}$. Impurity concentration of the n-type impurity of the n$^+$-type cathode region 18 is higher than impurity concentration of the n-type impurity of the n$^-$-type drift region 20. A portion of the n$^-$-type drift region 20 comes into contact with the anode electrode 12.

The n$^-$-type drift region 20 is provided in the SiC layer 10. The n$^-$-type drift region 20 is provided on the n$^+$-type cathode region 18.

The n$^-$-type drift region 20 contains n-type impurity. The n-type impurity is, for example, nitride (N). Impurity concentration of the n-type impurity is, for example, higher than or equal to $1\times10^{15}$ cm$^{-3}$ and lower than or equal to $2\times10^{16}$ cm$^{-3}$. A thickness of the n$^-$-type drift region 20 is, for example, greater than or equal to 3 μm and smaller than 30 μm.

An n-type barrier layer (not illustrated) with impurity concentration of the n-type impurity between the impurity concentration of the n$^+$-type cathode region 18 and the impurity concentration of the n$^-$-type drift region 20 may be provided between the n$^+$-type cathode region 18 and the n$^-$-type drift region 20.

The first anode region of a p-type 22 is provided in the SiC layer 10. The first anode region of a p-type 22 is provided between the n$^-$-type drift region 20 and the anode electrode 12.

The first anode region of a p-type 22 is provided in a bottom portion of a trench formed on the first surface. For example, after the trench is formed on the first surface, the first anode region of a p-type 22 is formed by injecting p-type impurity into the SiC layer 10, using an ion injection method. A depth of the trench is, for example, greater than or equal to 0.3 μm and smaller than or equal to 1.0 μm.

The first anode region of a p-type 22 is provided, for example, so as to surround the second anode region of a p$^+$-type 24, as illustrated in FIG. 2.

The first anode region of a p-type 22 contains p-type impurity. The p-type impurity is, for example, aluminum (Al). Impurity concentration of the p-type impurity is, for example, higher than or equal to $5\times10^{16}$ cm$^{-3}$ and lower than or equal to $5\times10^{18}$ cm$^{-3}$.

A depth of the first anode region of a p-type 22 which uses the first surface as a reference is, for example, greater than or equal to 0.7 μm and smaller than or equal to 2.0 μm. A width ("w1" of FIG. 1) of the first anode region of a p-type 22 is, for example, greater than or equal to 5.0 μm and smaller than or equal to 20.0 μm.

The second anode region of a p$^+$-type 24 is provided in the SiC layer 10. The second anode region of a p$^+$-type 24 is provided between the first anode region of a p-type 22 and the anode electrode 12. The second anode region of a p+-type 24 is provided inside of the first anode region of a p-type 22. The second anode region of a p+-type 24 is electrically coupled to the anode electrode 12.

The second anode region of a p+-type 24 is provided in a bottom portion of a trench formed on the first surface. For example, after the trench is formed on the first surface, the second anode region of a p+-type 24 is formed by injecting p-type impurity into the SiC layer 10 using an ion injection method, by using a mask member having an open portion through which a portion of the trench is exposed. A depth of the trench is, for example, greater than or equal to 0.3 μm and smaller than or equal to 1.0 μm.

The second anode region of a p+-type 24 contains p-type impurity. The p-type impurity is, for example, aluminum (Al). Impurity concentration of the second anode region of a p+-type 24 is higher than impurity concentration of the first anode region of a p-type 22. Impurity concentration of the p-type impurity is, for example, higher than or equal to $1 \times 10^{19}$ cm$^{-3}$ and lower than or equal to $1 \times 10^{21}$ cm$^{-3}$.

A depth of the second anode region of a p+-type 24 which uses the first surface as a reference is, for example, greater than or equal to 0.5 μm and smaller than or equal to 1.2 μm. A width of the second anode region of a p+-type 24 is, for example, greater than or equal to 2.0 μm and smaller than or equal to 15.0 μm.

The p-type edge region 23 is provided in the SiC layer 10. The p-type edge region 23 is provided between the n−-type drift region 20 and the anode electrode 12.

The p-type edge region 23 is provided in a bottom portion of a trench formed on the first surface. For example, after the trench is formed on the first surface, the p-type edge region 23 is formed by injecting p-type impurity into the SiC layer 10, using an ion injection method. A depth of the trench is, for example, greater than or equal to 0.3 μm and smaller than or equal to 1.0 μm. The p-type edge region 23 is formed at the same time as the first anode region of a p-type 22 by the same process steps as the first anode region of a p-type 22.

The p-type edge region 23 is provided, for example, in a ring shape in the periphery of an element region as illustrated in FIG. 2.

The p-type edge region 23 contains p-type impurity. The p-type impurity is, for example, aluminum (Al). Impurity concentration of p-type impurity is, for example, higher than or equal to $5 \times 10^{16}$ cm$^3$ and lower than or equal to $5 \times 10^{18}$ cm$^{-3}$.

A depth of the p-type edge region 23 which uses the first surface as a reference is, for example, greater than or equal to 0.7 μm and smaller than or equal to 2.0 μm. The depth of the p-type edge region 23 is equal to the depth of the first anode region of a p-type 22.

The p+-type edge contact region 25 is provided in the SiC layer 10. The p+-type edge contact region 25 is provided between the p-type edge region 23 and the anode electrode 12. The p+-type edge contact region 25 is provided inside of the p-type edge region 23. The p+-type edge contact region 25 is electrically coupled to the anode electrode 12. The p+-type edge contact region 25 is provided, for example, in a ring shape in the periphery of an element region as illustrated in FIG. 2.

The p+-type edge contact region 25 is provided in a bottom portion of a trench formed on the first surface. For example, after the trench is formed on the first surface, the p+-type edge contact region 25 is formed by injecting p-type impurity into the SiC layer 10 using an ion injection method, by using a mask member having an open portion through which a portion of the trench is exposed. A depth of the trench is, for example, greater than or equal to 0.3 μm and smaller than or equal to 1.0 μm. The p+-type edge contact region 25 is formed, for example, at the same time as the second anode region of a p+-type 24 by the same process steps as the second anode region of a p+-type 24.

The p+-type edge contact region 25 contains p-type impurity. The p-type impurity is, for example, aluminum (Al). Impurity concentration of the p+-type edge contact region 25 is higher than impurity concentration of the p-type edge region 23. Impurity concentration of the p-type impurity is, for example, higher than or equal to $1 \times 10^{19}$ cm$^3$ and lower than or equal to $1 \times 10^{21}$ cm$^{-3}$.

A depth of the p+-type edge contact region 25 which uses the first surface as a reference is, for example, greater than or equal to 0.5 μm and smaller than or equal to 1.2 μm.

The p−-type RESURF region 26 is provided in the SiC layer 10. The p−-type RESURF region 26 is provided so as to surround the first anode region of a p-type 22 and the p-type region 28. The p−-type RESURF region 26 is electrically coupled to the anode electrode 12.

A distance ("d2" of FIG. 1) between the second surface and the p−-type RESURF region 26 is greater than a distance ("d1" of FIG. 1) between the second surface and the first anode region of a p-type 22. That is, d2>d1 is satisfied. In other words, a depth of the p−-type RESURF region 26 which uses the first surface as a reference is smaller than a depth of the first anode region of a p-type 22 which uses the first surface as a reference.

Since a thickness of the n+-type cathode region 18 is substantially constant, a distance between the n+-type cathode region 18 and the p−-type RESURF region 26 is greater than a distance between the n+-type cathode region 18 and the first anode region of a p-type 22. In other words, a thickness of the n−-type drift region 20 between the n+-type cathode region 18 and the p−-type RESURF region 26 is greater than a thickness of the n−-type drift region 20 between the n+-type cathode region 18 and the first anode region of a p-type 22.

The p−-type RESURF region 26 has a termination structure for increasing a breakdown voltage of the JBS diode 100.

The p-type RESURF region 26 contains p-type impurity. The p-type impurity is, for example, aluminum (Al). Impurity concentration of the p-type impurity is, for example, higher than or equal to $1 \times 10^{16}$ cm$^3$ and lower than or equal to $1 \times 10^{18}$ cm$^{-3}$.

Impurity concentration of the p-type impurity of the p−-type RESURF region 26 is lower than the impurity concentration of the p-type impurity of the first anode region of a p-type 22 and the p-type edge region 23.

A plurality of p-type regions 28 are provided in the SiC layer 10 which is surrounded by the p−-type RESURF region 26. A width ("w2" of FIG. 1) of the p-type region 28 is smaller than the width ("w1" of FIG. 1) of the first anode region of a p-type 22. That is, w2<w1 is satisfied. The p-type region 28 comes into contact with the anode electrode 12.

The p-type region 28 is, for example, a stripe shape, as illustrated in FIG. 2.

The distance ("d2" of FIG. 1) between the second surface and the p−-type RESURF region 26 is greater than a distance ("d3" of FIG. 1) between the second surface and the p-type region 28. That is, d2>d3 is satisfied. In other words, a depth of the p−-type RESURF region 26 which uses the first surface as a reference is smaller than the depth of the p-type region 28 which uses the first surface as a reference.

The p-type region 28 contains p-type impurity. The p-type impurity is, for example, aluminum (Al). Impurity concentration of the p-type impurity is, for example, higher than or equal to $5\times10^{16}$ cm$^{-3}$ and lower than or equal to $5\times10^{18}$ cm$^{-3}$.

A depth of the p-type region 28 which uses the first surface as a reference is, for example, greater than or equal to 0.7 µm and smaller than or equal to 2.0 µm. A width ("w2" of FIG. 1) of the p-type region 28 is, for example, greater than or equal to 1.0 µm and smaller than or equal to 3.0 µm. An interval between the p-type regions 28 is, for example, greater than or equal to 1.0 µm and smaller than or equal to 5.0 µm.

The p-type region 28 is provided in a bottom portion of a trench formed on the first surface. For example, after the trench is formed on the first surface, the p-type region 28 is formed by injecting p-type impurity into the SiC layer 10, using an ion injection method. A depth of the trench is, for example, greater than or equal to 0.3 µm and smaller than or equal to 1.0 µm.

For example, the distance ("d1" of FIG. 1) between the second surface and the first anode region of a p-type 22 is approximately equal to a distance ("d3" of FIG. 1) between the second surface and the p-type region 28. That is, d1=d3 is satisfied. In addition, impurity concentration of the p-type impurity of the first anode region of a p-type 22 is substantially equal to impurity concentration of the p-type impurity of the p-type region 28.

For example, the p-type region 28 and the first anode region of a p-type 22 are formed by the same process steps. For example, a trench for forming the p-type region 28 and a trench for forming the first anode region of a p-type 22 are simultaneously formed. Thereafter, the p-type impurity is injected into a bottom portion of the trench using an ion injection method, and the impurity is activated by annealing.

By the process steps, the distance ("d1" of FIG. 1) between the second surface and the first anode region of a p-type 22 becomes approximately equal to the distance ("d3" of FIG. 1) between the second surface and the p-type region 28. In addition, the impurity concentration of the p-type impurity of the first anode region of a p-type 22 becomes approximately equal to the impurity concentration of the p-type impurity of the p-type region 28.

The silicide layer 30 is provided between the second anode region of a p$^+$-type 24 and the anode electrode 12. The silicide layer 30 is, for example, a nickel silicide layer or a titanium silicide layer. A thickness of the silicide layer 30 is, for example, greater than or equal to 0.05 µm and smaller than or equal to 0.3 µm.

The field oxide film 16 is provided on the p$^-$-type RESURF region 26. The field oxide film 16 is, for example, a silicon oxide film. The field oxide film 16 has an opening. A thickness of the field oxide film 16 is, for example, greater than or equal to 0.2 µm and smaller than or equal to 1.0 µm.

The anode electrode 12 comes into contact with the n$^-$-type drift region 20, the silicide layer 30, and the p-type region 28 through an opening of the field oxide film 16. The anode electrode 12 is embedded in the trench provided at the first anode region of a p-type 22 and the trench provided at the p-type region 28. In other words, a portion of the anode electrode 12 on the first anode region of a p-type 22 is disposed within the n$^-$-type drift region 20. In addition, a portion of the anode electrode 12 on the p-type region 28 is disposed within the n$^-$-type drift region 20.

The anode electrode 12 comes into contact with the n$^-$-type drift region 20, namely an upper portion of the first surface, and a side surface of the trench. The contact between the n$^-$-type drift region 20 and the anode electrode 12 is Schottky contact.

The anode electrode 12 is formed of a metal. The anode electrode 12 is formed of, for example, a stacked film of titanium (Ti) and aluminum (Al).

The cathode electrode 14 is provided so as to come into contact with the n$^+$-type cathode region 18. The contact between the cathode electrode 14 and the n$^+$-type cathode region 18 is Ohmic contact.

The cathode electrode 14 is formed of a metal. The cathode electrode 14 is formed of, for example, a stacked film of titanium (Ti) and aluminum (Al).

Next, actions and effects of the JBS diode 100 according to the present embodiment will be described.

Figure 3:
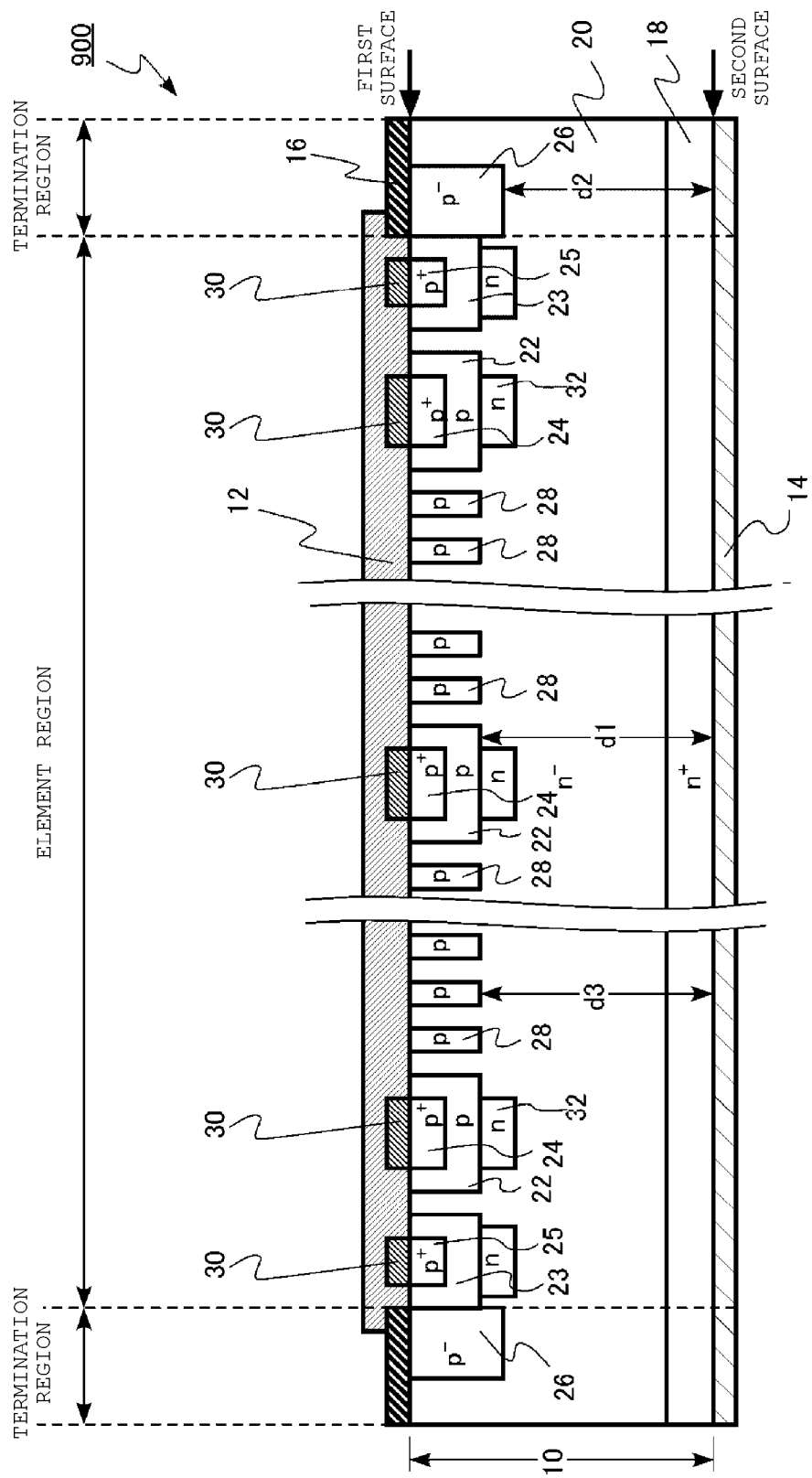
FIG. 3 is a schematic sectional view of a semiconductor device according to a comparative example.

FIG. 3 is a schematic sectional view of a semiconductor device according to a comparative example. The semiconductor device according to the comparative example is a JBS diode. A JBS diode 900 according to the comparative example is a planar type JBS diode without trenches in contrast to the JBS diode 100 according to the present embodiment.

In the JBS diode 900, the first anode region of a p-type 22 and the p-type region 28 are provided in a first surface, not in a bottom portion of a trench. The distance ("d2" of FIG. 3) between a second surface and the p-type RESURF region 26 is smaller than the distance ("d1" of FIG. 3) between the second surface and the first anode region of a p-type 22. That is, d2<d1 is satisfied.

In addition, the distance ("d2" of FIG. 3) between the second surface and the p$^-$-type RESURF region 26 is smaller than a distance ("d3" of FIG. 3) between the second surface and the p-type region 28. That is, d2<d3 is satisfied.

The JBS diode 900 includes an n-type region 32 between the n$^-$-type drift region 20 and the first anode region of a p-type 22. The n-type region 32 contains n-type impurity. The n-type impurity is, for example, nitride (N). Impurity concentration of the n-type impurity is, for example, higher than or equal to $1\times10^{17}$ cm$^{-3}$ and lower than or equal to $1\times10^{19}$ cm$^{-3}$. Impurity concentration of the n-type impurity of the n-type region 32 is higher than impurity concentration of the n-type impurity of the n$^-$-type drift region 20.

In the JBS diode 900, by providing the p-type region 28, the n$^-$-type drift region 20 between the p-type regions 28 is pinched off by depletion layers, if a reverse bias is applied to the JBS diode 900. Hence, it is possible to reduce a reverse current ($I_R$) of the JBS diode 900.

Furthermore, the JBS diode 900 includes the anode electrode 12, the silicide layer 30, the second anode region of a p$^+$-type 24, the first anode region of a p-type 22, the n-type region 32, the n$^-$-type drift region 20, and a PIN diode section including the cathode electrode 14, in an element region. By including the PIN diode section, a large forward surge current flow becomes possible.

In addition, in the JBS diode 900, by providing the n-type region 32 in the PIN diode section, the profile of a pn junction is steepened, and a junction breakdown voltage of the PIN diode section is lower than a junction breakdown voltage of a termination structure formed by the p$^-$-type RESURF region 26.

Hence, junction breakdown at the time of a reverse bias is easily achieved in the PIN diode section rather than a termination structure. In the PIN diode section, the junction breakdown is achieved in an area wider than the termination structure. For this reason, it is possible to prevent heat or the like from being generated due to the junction breakdown, and to prevent an element from breaking down.

However, in the JBS diode 900, the junction breakdown voltage of the PIN diode section is lower than the junction breakdown voltage of the termination structure formed in the p⁻-type RESURF region 26, and thus an additional process step for forming the n-type region 32 is needed. In addition, by providing the n-type region 32, there is concern that a junction leakage current of the PIN diode section at the time of a reverse bias increases due to crystal defects or the like, and a reverse current ($I_R$) of the JBS diode 900 increases.

In addition, in the JBS diode 900, the p-type region 28 or the first anode region of a p-type 22 is provided in an element region. For this reason, a contact area between the anode electrode 12 and the n⁻-type drift region 20, that is, an area of Schottky contact decreases, and a forward voltage ($V_F$) of the JBS diode 900 increases.

In the JBS diode 100 according to the present embodiment, the distance ("d2" of FIG. 1) between the second surface and the p⁻-type RESURF region 26 is greater than the distance ("d1" of FIG. 1) between the second surface and the first anode region of a p-type 22. That is, d2>d1 is satisfied.

Hence, the thickness of the n⁻-type drift region 20 under the PIN diode section becomes smaller than that of the JBS diode 900. The junction breakdown voltage of the PIN diode section decreases as the thickness of the n⁻-type drift region 20 is decreases. Hence, in the JBS diode 100 according to the present embodiment, it is possible to decrease the junction breakdown voltage of the PIN diode section without providing the n-type region 32.

Particularly, since the thickness of the n⁻-type drift region 20 under the PIN diode section is smaller than the thickness of the n⁻-type drift region 20 under the p⁻-type RESURF region 26, the junction breakdown at the time of a reverse bias is easily achieved in the PIN diode section rather than the termination structure.

In addition, since the n-type region 32 is not provided, it is possible to reduce the reverse current ($I_R$) more than the JBS diode 900.

Furthermore, by providing a trench type JBS diode, a forward voltage ($V_F$) can be reduced. Reduction of the forward voltage ($V_F$) can be achieved by making the anode electrode 12 come into contact with the n⁻-type drift region 20 on the side surface of the trench, and increasing an area of Schottky contact.

In the JBS diode 100, it is possible to improve trade-off between the forward voltage ($V_F$) and the reverse current ($I_R$) by providing the trench type JBS diode.

In addition, in the JBS diode 100 according to the present embodiment, it is possible to easily form a trench type JBS diode and a PIN diode section with a low junction breakdown voltage, using the same process steps. In addition, because it is difficult to forma deep impurity region in the SiC layer, using an ion injection method, compared to, for example, a silicon (Si) layer, in the embodiments, process steps in which the deep first anode region of a p-type 22 is formed by using trench formation.

It is preferable that impurity concentration of the p-type impurity of the p⁻-type RESURF region 26 be lower than impurity concentration of the p-type impurity of the first anode region of a p-type 22, from a viewpoint in which junction breakdown at the time of a reverse bias is easily achieved in a PIN diode section rather than in a termination structure.

In addition, it is preferable that the silicide layer 30 is provided from a viewpoint in which a resistance between the anode electrode 12 and the first anode region of a p-type 22 is reduced.

As such, according to the present embodiment, it is possible to achieve the JBS diode 100 which can prevent an element from breaking down at the time of a reverse bias. In addition, it is possible to achieve the JBS diode 100 in which a reverse current ($I_R$) is reduced. In addition, it is possible to achieve the JBS diode 100 in which a forward voltage ($V_F$) is reduced.

Second Embodiment

A semiconductor device according to the present embodiment is the same as the semiconductor device according to the first embodiment except that the semiconductor device according to the present embodiment does not include the fifth semiconductor region. Hence, description of the contents which overlap with the contents of the first embodiment will be omitted.

Figure 4:
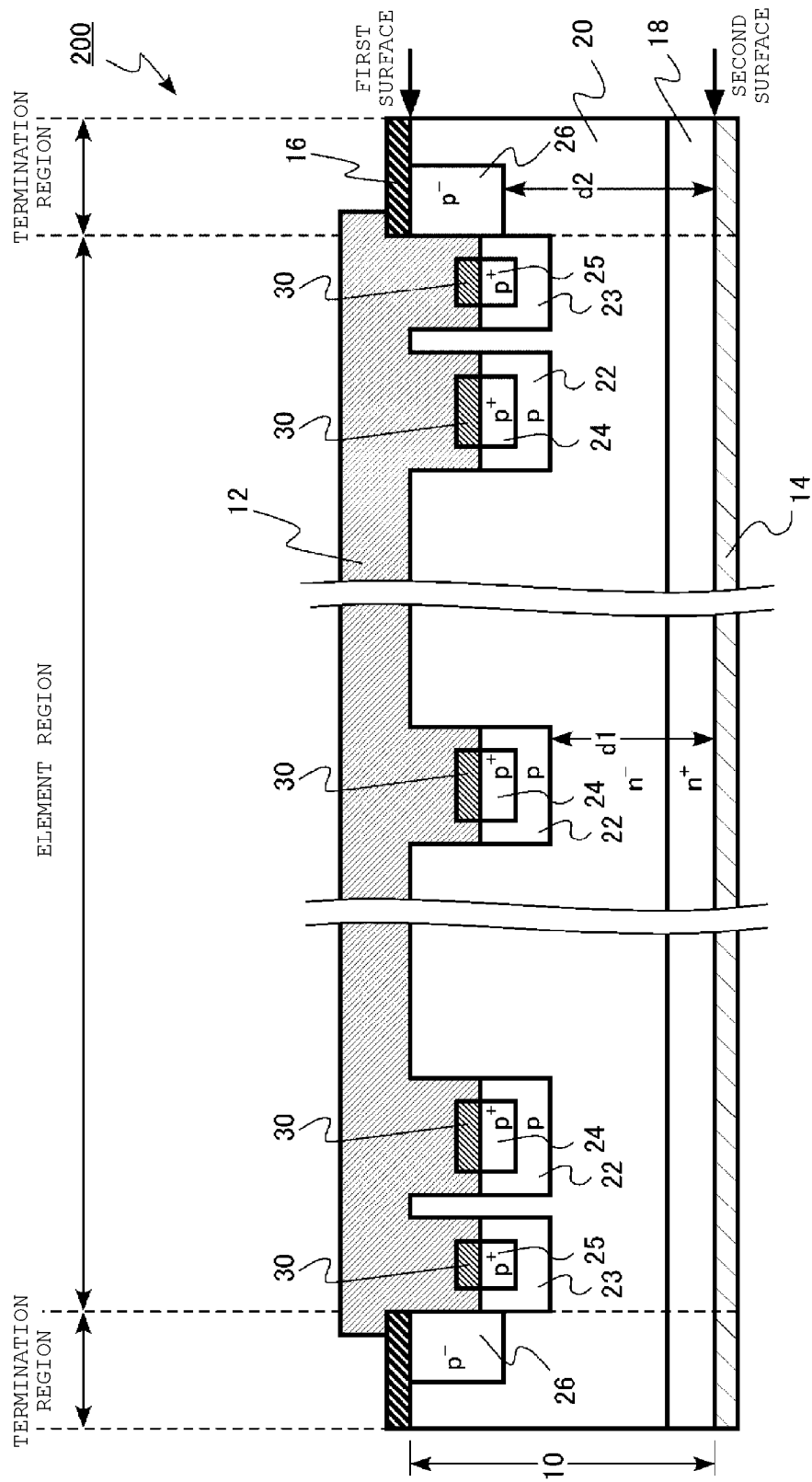
FIG. 4 is a schematic sectional view of a semiconductor device according to a second embodiment.

FIG. 4 is a schematic sectional view of a semiconductor device according to the present embodiment.

The semiconductor device according to the present embodiment is an SBD. The SBD 200 according to the present embodiment is different from the JBS diode 100 according to the first embodiment, and does not include the p-type region 28.

The SBD 200 includes an element region and a termination region. The element region is surrounded by the termination region.

The SBD 200 includes the SiC layer (semiconductor layer) 10, the anode electrode (first electrode) 12, the cathode electrode (second electrode) 14, the field oxide film 16, and the silicide layer 30. The SiC layer 10 includes the first surface and the second surface. The anode electrode 12 is provided on the first surface of the SiC layer 10. The cathode electrode 14 is provided on the second surface of the SiC layer 10. The field oxide film 16 is provided on the first surface of the semiconductor layer 10.

The SiC layer 10 includes the n⁺-type cathode region (sixth semiconductor region) 18, the n⁻-type drift region (first semiconductor region) 20, the first anode region of a p-type (second semiconductor region) 22, the second anode region of a p⁺-type (third semiconductor region) 24, the p⁻-type RESURF region (fourth semiconductor region) 26, the p-type edge region 23, and the p⁺-type edge contact region 25.

The first anode region of a p-type 22 is provided in a bottom portion of the trench formed on the first surface. For example, after the trench is formed on the first surface, the first anode region of a p-type 22 is formed by injecting p-type impurity into the SiC layer 10, using an ion injection method.

A distance ("d2" of FIG. 4) between the second surface and the p⁻-type RESURF region 26 is greater than a distance ("d1" of FIG. 4) between the second surface and the first anode region of a p-type 22. That is, d2>d1 is satisfied. In other words, a depth of the p⁻-type RESURF region 26 which uses the first surface as a reference is smaller than a depth of the first anode region of a p-type 22 which uses the first surface as a reference.

According to the present embodiment, it is possible to achieve the SBD 200 which can prevent an element from breaking down at the time a reverse bias is applied, as explained above in conjunction with the first embodiment.

In the first and second embodiments, a SiC layer is exemplified as a semiconductor layer, but embodiments can also be applied to a diode which uses, for example, a silicon (Si) layer other than the SiC layer.

In addition, in the first and second embodiments, a case in which 4H—SiC is used as SiC is described as an example, but other crystal forms, such as 3C—SiC or 6H—SiC, can also be used.

In addition, in the first and second embodiments, a case in which, if the semiconductor layer is the SiC layer, the first surface is a surface inclined at an angle greater than or equal to zero degrees and smaller than or equal to eight degrees with respect to (0001) surface, and the second surface is a surface inclined at an angle greater than or equal to zero degrees and smaller than or equal to eight degrees with respect to (000-1) surface is described as an example, but other surfaces of surface orientation can also be used.

In addition, in the first and second embodiments, an example in which nitride (N) is used as n-type impurity is described, but phosphorus (P), arsenic (As), antimony (Sb), or the like can also be applied. In addition, an example in which aluminum (Al) is used as p-type impurity is described, but boron (B) can also be used.

In addition, in the first and second embodiments, an example in which an n-type is used as the first conductivity type and a p-type is used as the second conductivity type is described, but a p-type can also be used as the first conductivity type and an n-type can also be used as the second conductivity type.

In addition, in the first embodiment, a case in which Schottky contact of the anode electrode 12 is provided on a side surface of a trench is described as an example, but a form in which the side surface of the trench is covered with the p-type region 28 can also be used.

In addition, in the first embodiment, an example in which a trench type JBS diode is used is described, but embodiments can also be applied to a planar type JBS diode in which the p-type region 28 is provided on the first surface.

In addition, the shape of the first anode region 22 is not limited to the shape in FIG. 2, and can be formed by other shapes such as a stripe shape or a dot shape. In addition, the shape of the p-type region 28 is not limited to the shape in FIG. 2, and can be formed by other shapes such as a ring shape or a dot shape.

In addition, in the first and second embodiments, a case in which the trench is provided on the first anode region 22 is described as an example, but a form in which the first anode region 22 is provided on the first surface without providing the trench can also be used. In this case, the first anode region 22 is formed by, for example, high speed ion injection of p-type impurity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor layer having a first surface and a second surface and including an element region surrounded by a termination region;
    a first electrode on the first surface;
    a second electrode on the second surface;
    a first semiconductor region of a first conductivity type in the semiconductor layer, a portion of the first semiconductor region being in contact with the first electrode;
    a second semiconductor region of a second conductivity type in the element region of the semiconductor layer between the first semiconductor region and the first electrode;
    a third semiconductor region of the second conductivity type that is between the second semiconductor region and the first electrode, and is electrically coupled to the first electrode, an impurity concentration of the second conductive type in the third semiconductor region being higher than an impurity concentration of the second conductivity type in the second semiconductor region; and
    a fourth semiconductor region of the second conductivity type that is in the termination region of the semiconductor layer inwardly of the first surface, and is electrically coupled to the first electrode, wherein
    a distance between the fourth semiconductor region and the second surface is greater than a distance between the second semiconductor region and the second surface.

2. The device according to claim 1, wherein the impurity concentration of the second conductivity type in the fourth semiconductor region is lower than the impurity concentration of the second conductivity type in the second semiconductor region.

3. The device according to claim 1, further comprising:
    a plurality of fifth semiconductor regions of the second conductivity type, each of which is in the element region, is electrically coupled to the first electrode, and has a width smaller than a width of the second semiconductor region.

4. The device according to claim 3, wherein a distance between the fourth semiconductor region and the second surface is greater than a distance between the fifth semiconductor region and the second surface.

5. The device according to claim 4, wherein the distance between the second semiconductor region and the second surface is substantially equal to the distance between the fifth semiconductor region and the second surface, and the impurity concentration of the second conductivity type in the second semiconductor region is substantially equal to the impurity concentration of the second conductivity type in the fifth semiconductor region.

6. The device according to claim 5, wherein the fifth semiconductor region is in direct contact with the first electrode.

7. The device according to claim 3, wherein portions of the first electrode on the fifth semiconductor regions are disposed within the first semiconductor region.

8. The device according to claim 1, wherein a portion of the first electrode on the second semiconductor region is disposed within the first semiconductor region.

9. The device according to claim 1, further comprising:
    a semiconductor region of the first conductivity type that is between the second electrode and the first semiconductor region, and has an impurity concentration of the first conductivity type that is higher than an impurity concentration of the first conductivity type in the first semiconductor region.

10. The device according to claim 1, wherein contact between the first semiconductor region and the first electrode is a Schottky contact.

11. The device according to claim 1, wherein the semiconductor layer is an SiC layer.

12. The device according to claim 1, further comprising:
a silicide layer between the third semiconductor region and the first electrode.

13. A semiconductor device comprising:
a semiconductor layer having a first surface and a second surface and including an element region surrounded by a termination region;
a first electrode on the first surface;
a second electrode on the second surface;
a first semiconductor region of a first conductivity type in the semiconductor layer, a portion of the first semiconductor region being in contact with the first electrode;
a second semiconductor region of a second conductivity type in the element region of the semiconductor layer between the first semiconductor region and the first electrode;
a third semiconductor region of the second conductivity type that is between the second semiconductor region and the first electrode, and is electrically coupled to the first electrode, an impurity concentration of the second conductivity type in the third semiconductor region being higher than an impurity concentration of the second conductivity type in the second semiconductor region; and
a fourth semiconductor region of the second conductivity type that is in the termination region of the semiconductor layer inwardly of the first surface, and is electrically coupled to the first electrode, wherein
a depth of the fourth semiconductor region from the first surface is smaller than a depth of the second semiconductor region from the first surface.

14. The device according to claim 13, wherein the impurity concentration of the second conductivity type in the fourth semiconductor region is lower than the impurity concentration of the second conductivity type in the second semiconductor region.

15. The device according to claim 13, further comprising:
a plurality of fifth semiconductor regions of the second conductivity type, each of which is in the element region, is electrically coupled to the first electrode, and has a width smaller than a width of the second semiconductor region.

16. The device according to claim 15, wherein a depth of the fourth semiconductor region from the first surface is smaller than a depth of the fifth semiconductor region from the first surface.

17. The device according to claim 16, wherein the depth of the second semiconductor region from the first surface is substantially equal to the depth of the fifth semiconductor region from the first surface, and the impurity concentration of the second conductivity type in the second semiconductor region is substantially equal to the impurity concentration of the second conductivity type in the fifth semiconductor region.

18. The device according to claim 17, wherein the fifth semiconductor region is in direct contact with the first electrode.

19. The device according to claim 13, wherein portions of the first electrode on the fifth semiconductor regions are disposed within the first semiconductor region.

20. The device according to claim 13, wherein a portion of the first electrode on the second semiconductor region is disposed within the first semiconductor region.

* * * * *